United States Patent
Oguri

(10) Patent No.: US 11,561,186 B2
(45) Date of Patent: Jan. 24, 2023

(54) METHOD FOR INSPECTING SURFACE OF WAFER, DEVICE FOR INSPECTING SURFACE OF WAFER, AND MANUFACTURING METHOD OF ELECTRONIC COMPONENT

(71) Applicant: SUMITOMO ELECTRIC DEVICE INNOVATIONS, INC., Kanagawa (JP)

(72) Inventor: Hiroyuki Oguri, Yokohama (JP)

(73) Assignee: SUMITOMO ELECTRIC DEVICE INNOVATIONS, INC., Kanagawa (JP)

( * ) Notice: Subject to any disclaimer, the term of this patent is extended or adjusted under 35 U.S.C. 154(b) by 144 days.

(21) Appl. No.: 16/900,492

(22) Filed: Jun. 12, 2020

(65) Prior Publication Data
US 2020/0400587 A1 Dec. 24, 2020

(30) Foreign Application Priority Data
Jun. 18, 2019 (JP) .............................. JP2019-113171

(51) Int. Cl.
| | |
|---|---|
| G01N 21/95 | (2006.01) |
| G01N 21/94 | (2006.01) |
| G01N 21/55 | (2014.01) |
| H01L 21/67 | (2006.01) |
| H01L 21/66 | (2006.01) |
| H01L 21/288 | (2006.01) |

(Continued)

(52) U.S. Cl.
CPC ......... *G01N 21/9501* (2013.01); *G01N 21/55* (2013.01); *G01N 21/94* (2013.01); *H01L 21/288* (2013.01); *H01L 21/67288* (2013.01); *H01L 22/20* (2013.01); *H01L 28/60* (2013.01); *G01N 2021/8845* (2013.01)

(58) Field of Classification Search
None
See application file for complete search history.

(56) References Cited

U.S. PATENT DOCUMENTS 5,072,128 A * 12/1991 Hayano .................. G01N 21/94
250/226
2003/0103203 A1  6/2003 Isozaki
(Continued)

FOREIGN PATENT DOCUMENTS

| JP | H07-134103 | 5/1995 |
|---|---|---|
| JP | 2003-166947 | 6/2003 |

(Continued)

OTHER PUBLICATIONS

Notice of Reasons for Refusal (JPO, dated Nov. 22, 2022.

*Primary Examiner* — Evren Seven
(74) *Attorney, Agent, or Firm* — Smith, Gambrell & Russell, LLP.

(57) ABSTRACT

A method for inspecting a surface of a wafer, includes steps of: irradiating a surface of the wafer with a laser beam having three or more distinct wavelengths; detecting a reflected light from the surface of the wafer when the surface of the wafer is irradiated with the laser beam; and determining whether a foreign matter exists on the surface of the wafer based on reflectances of the surface of the wafer with respect to the laser beam having the three or more distinct wavelengths, wherein the step of determining whether the foreign matter exists includes a step of determining whether the foreign matter is a metal or a non-metal.

4 Claims, 10 Drawing Sheets

(51) Int. Cl.
*H01L 49/02* (2006.01)
*G01N 21/88* (2006.01)

(56) References Cited

U.S. PATENT DOCUMENTS

| | | | |
|---|---|---|---|
| 2005/0219518 A1* | 10/2005 | Korngut | G01N 21/47 356/237.2 |
| 2016/0293334 A1 | 10/2016 | Ehara | |
| 2016/0334342 A1 | 11/2016 | Chuang et al. | |
| 2020/0110029 A1* | 4/2020 | Lei | G01N 21/211 |

FOREIGN PATENT DOCUMENTS

| | | |
|---|---|---|
| JP | 2005-147874 | 6/2005 |
| JP | 2016-166813 | 9/2016 |
| JP | 2016-195161 | 11/2016 |
| JP | 2018-517902 | 7/2018 |

* cited by examiner

METHOD FOR INSPECTING SURFACE OF WAFER, DEVICE FOR INSPECTING SURFACE OF WAFER, AND MANUFACTURING METHOD OF ELECTRONIC COMPONENT

CROSS-REFERENCE TO RELATED APPLICATION

This application is based upon and claims the benefit of priority of the prior Japanese Patent Application No. 2019-113171, filed on Jun. 18, 2019, the entire contents of which are incorporated herein by reference.

BACKGROUND

(i) Technical Field

The present invention relates to a method for inspecting a surface of a wafer, a device for inspecting a surface of a wafer, and a manufacturing method of an electronic component.

(ii) Related Art

The surface of a wafer is inspected by irradiating the surface with a light. For example, Japanese Patent Application Publication No. H7-134103 discloses a technique for detecting a defect of the surface. Japanese Patent Application Publication Nos. 2005-147874 and 2018-517902 disclose a technique for detecting foreign matters adhering to the surface.

SUMMARY

Metallic foreign matters may adhere to a wafer, or non-metallic foreign matters such as resist may adhere to a wafer. It is preferable to determine that the wafer is a non-defective product when the foreign matter is a metal, and that the wafer is a defective product when the foreign matter is a non-metal. Thus, it is important to determine whether the foreign matter is a metal or a non-metal. However, it may take a long time to determine the foreign matter. Thus, the purpose of the present invention is to provide a method for inspecting a surface of a wafer that enables to determine whether the foreign matter is a metal or a non-metal rapidly.

According to a first aspect of the present invention, there is provided a method for inspecting a surface of a wafer, the method comprising steps of: irradiating a surface of the wafer with a laser beam having three or more distinct wavelengths; detecting a reflected light from the surface of the wafer when the surface of the wafer is irradiated with the laser beam; and determining whether a foreign matter exists on the surface of the wafer based on reflectances of the surface of the wafer with respect to the laser beam having the three or more distinct wavelengths, wherein the step of determining whether the foreign matter exists includes a step of determining whether the foreign matter is a metal or a non-metal.

According to a second aspect of the present invention, there is provided a device for inspecting a surface of a wafer, the device including: a laser source irradiating a surface of the wafer with a laser beam having three or more distinct wavelengths; a detector detecting a reflected light from the wafer when the surface of the wafer is irradiated with the laser beam; and a controller determining whether a foreign matter exists and whether the foreign matter is a metal or a non-metal based on reflectances with respect to the laser beam having the three or more distinct wavelengths.

According to a third aspect of the present invention, there is provided a manufacturing method of an electronic component, comprising steps of: forming a metal layer on a surface of a wafer; forming a resist pattern on a surface of the metal layer; irradiating the surface of the wafer with a laser beam having three or more distinct wavelengths after the step of forming the resist pattern to determine whether a foreign matter exists on the surface of the wafer based on reflectances with respect to the laser beam having the three or more distinct wavelengths; when the foreign matter exists, determining whether the foreign matter is a metal or a non-metal; and when no foreign matter exists or when the foreign matter is a metal, forming a plated layer on the metal layer.

DETAILED DESCRIPTION

Figure 1:
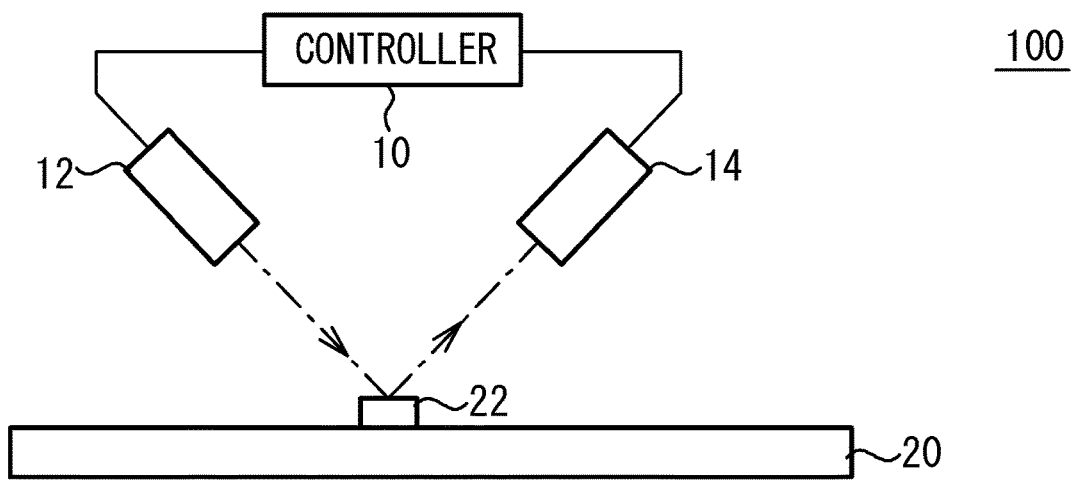
FIG. 1 is a schematic view illustrating a surface inspection device in accordance with a first embodiment.

Description of Embodiments of the Present Invention

First, details of embodiments of the present invention will be described as listed below. An embodiment of the present invention is (1) a method for inspecting a surface of a wafer, the method including steps of: irradiating a surface of the wafer with a laser beam having three or more distinct wavelengths; detecting a reflected light from the surface of the wafer when the surface of the wafer is irradiated with the laser beam; and determining whether a foreign matter exists on the surface of the wafer based on reflectances of the surface of the wafer with respect to the laser beam having the three or more distinct wavelengths, wherein the step of determining whether the foreign matter exists includes a step of determining whether the foreign matter is a metal or a non-metal. The reflectance of a metal does not greatly vary with respect to wavelength, whereas the reflectance of a non-metal such as resist periodically varies with respect to wavelength. Thus, it can be rapidly determined whether a foreign matter exists, and whether the foreign matter is a metal or a non-metal.

(2) The step of determining whether the foreign matter is a metal or a non-metal may include steps of: obtaining respective reflectances at the distinct wavelengths, and determining whether the foreign matter is a metal or a non-metal based on a difference between two reflectances of the respective reflectances at the distinct wavelengths. The difference between the reflectances at the distinct wavelengths is large in a non-metallic foreign matter such as resist compared with that in a metallic foreign matter. Thus, it is possible to precisely determine whether a foreign matter exists and whether the foreign matter is a metal or a non-metal.

(3) The step of determining whether the foreign matter is a metal or a non-metal may include steps of: obtaining a largest reflectance and a smallest reflectance among the respective reflectances at the distinct wavelengths, obtaining a difference between the largest reflectance and the smallest reflectance and a sum of the largest reflectance and the smallest reflectance, and determining that the foreign matter is a metal when a ratio of the difference to the sum is less than 0.15, and that the foreign matter is a non-metal when the ratio is 0.15 or greater. The difference between the reflectances at distinct wavelengths is large in a non-metallic foreign matter such as resist compared with that in a metallic foreign matter. Thus, the ratio obtained from the sum of and the difference between the reflectances is also large. Thus, it is possible to precisely determine whether a foreign matter exists and whether the foreign matter is a metal or a non-metal.

(4) Each of the three or more distinct wavelengths of the laser beam may be 600 nm or greater. The reflectance of a metal does not greatly vary with respect to laser beams having wavelengths of 600 nm or greater. On the other hand, the reflectance of a non-metal such as resist periodically varies. Thus, it is possible to precisely determine whether a foreign matter exists and whether the foreign matter is a metal or a non-metal.

(5) The method may further include a step of: irradiating the surface of the wafer with a laser beam having five or more distinct wavelengths. It is possible to precisely determine whether a foreign matter exists and whether the foreign matter is a metal or a non-metal.

(6) A device for inspecting a surface of a wafer, includes: a laser source irradiating a surface of the wafer with a laser beam having three or more distinct wavelengths; a detector detecting a reflected light from the wafer when the surface of the wafer is irradiated with the laser beam; and a controller determining whether a foreign matter exists and whether the foreign matter is a metal or a non-metal based on reflectances with respect to the laser beam having the three or more distinct wavelengths. The reflectance of a non-metal such as resist periodically varies with respect to wavelength. Thus, it is possible to precisely determine whether a foreign matter exists and whether the foreign matter is a metal or a non-metal.

(7) A manufacturing method of an electronic component, includes steps of: forming a metal layer on a surface of a wafer; forming a resist pattern on a surface of the metal layer; irradiating the surface of the wafer with a laser beam having three or more distinct wavelengths after the step of forming the resist pattern to determine whether a foreign matter exists on the surface of the wafer based on reflectances with respect to the laser beam having the three or more distinct wavelengths; when the foreign matter exists, determining whether the foreign matter is a metal or a non-metal; and when no foreign matter exists or when the foreign matter is a metal, forming a plated layer on the metal layer. The reflectance of a non-metal such as resist periodically varies with respect to wavelength. Thus, it is possible to precisely determine whether a foreign matter exists and whether the foreign matter is a metal or a non-metal.

(8) The electronic component may be a capacitor, the plated layer may be included in a lower electrode of the capacitor, and the manufacturing method may further include steps of: forming a dielectric film on the plated layer; and forming an upper electrode on the dielectric film. A non-metallic foreign matter may cause a defect in the dielectric film, resulting in a short circuit between the electrodes. The manufacture of the capacitor in which a short circuit may occur is inhibited by determining whether the foreign matter is a metal or a non-metal.

Details of Embodiments of the Present Invention

The following describes a specific example of a method for inspecting a surface of a wafer, a surface inspection device, and a manufacturing method of an electronic component in accordance with an embodiment of the present invention, with reference to the drawings. It should be noted that the present invention is not limited to these examples but is shown by the claims, and it is intended that all modifications are included in the equivalents of the claims and the scope of the claims.

First Embodiment

Surface Inspection Device

FIG. 1 schematically illustrates a surface inspection device 100 in accordance with a first embodiment. As illustrated in FIG. 1, the surface inspection device 100 includes a controller 10, a laser source 12, and a detector 14. The object that is subject to inspection is a wafer 20, and a foreign matter 22 may adhere to the surface of the wafer 20.

The laser source 12 is a semiconductor laser including, for example, gallium indium phosphorus (GaInP) and aluminum gallium indium phosphorus (AlGaInP). The oscillation wavelength of the laser source 12 can be adjusted by the composition of the semiconductor, and the laser source 12 emits a laser beam having three or more distinct wavelengths. Three wavelengths are, for example, 600 nm or greater and 1000 nm or less. The detector 14 includes a light receiving element such as, but not limited to, a photo diode.

The controller 10 includes an arithmetic device such as, but not limited to, a central processing unit (CPU) and a storage device such as a hard disk drive (HDD). The controller 10 is coupled to the laser source 12 and the detector 14 to control them. The controller 10 calculates the light reflectance of the foreign matter 22 based on the intensity of the light emitted from the laser source 12 and the intensity of the reflected light received by the detector 14.

When the foreign matter 22 is a metal, the laser beam is reflected by the surface of the foreign matter 22.

On the other hand, when the foreign matter 22 is an organic substance such as resist, the foreign matter 22 is transparent. Thus, a part of the laser beam is reflected by the surface of the foreign matter 22, and another part of the laser beam is reflected by the boundary face between the foreign matter 22 and the wafer 20. Since two reflected lights interfere with each other, the intensity of the reflected light periodically varies with respect to wavelength as described later.

Wafer 20

Electronic components such as, but not limited to, metal insulation metal (MIM) capacitors are formed on the wafer 20. The surface inspection is included in the manufacturing method of the capacitor. FIG. 2A to FIG. 2D and FIG. 3A to FIG. 4B are cross-sectional views illustrating a manufacturing method of a capacitor. FIG. 2A to FIG. 2D illustrate an example where no foreign matter adheres.

Figure 2A:
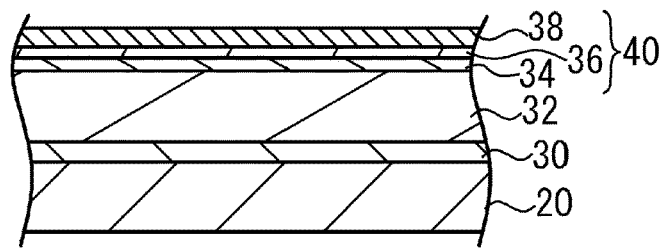
FIG. 2A to FIG. 2D are cross-sectional views illustrating a manufacturing method of a capacitor.
Figure 2B:
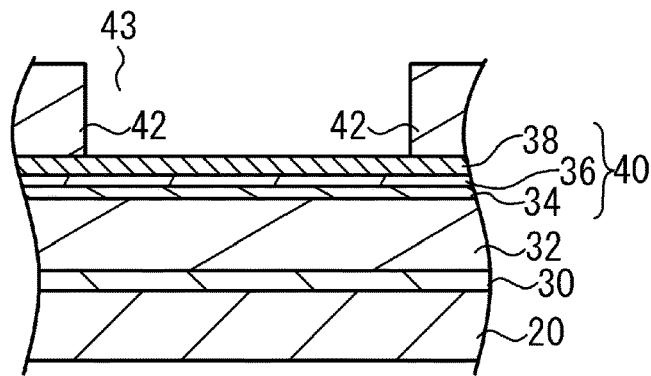

As illustrated in FIG. 2A, a dielectric film 30 and a polyimide film 32 are formed on the surface of the wafer 20, and a seed metal 40 (a metal layer) is then formed by sputtering or the like. The seed metal 40 includes a titanium (Ti) layer 34, a gold (Au) layer 36, and a Ti layer 38 that are stacked in this order from the wafer 20 side. As illustrated in FIG. 2B, resist 42 is formed on the Ti layer 38. The resist 42 is novolac-based positive resist having, for example, a refractive index of 1.6 and a thickness of 1.5±0.1 μm. A resist pattern is formed by exposure and development by an ultraviolet light. The exposed area of the resist 42 is removed, and an opening 43 is formed in that area.

Figure 2C:
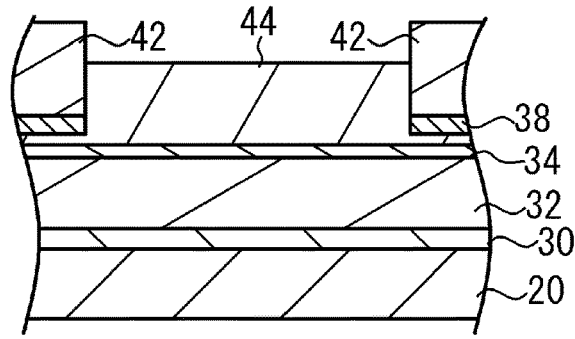

As illustrated in FIG. 2C, the Ti layer 38 included in the seed metal 40 and exposed from the opening 43 is removed by reactive ion etching (RIE) using, for example, a fluorine-based gas. A plated layer 44 of Au is formed by electrolytic plating using the seed metal 40. The plated layer 44 is filled into the opening 43. The Au layer 36 of the seed metal 40 is Au identical to the plated layer 44, and the illustration thereof is thus omitted.

Figure 2D:
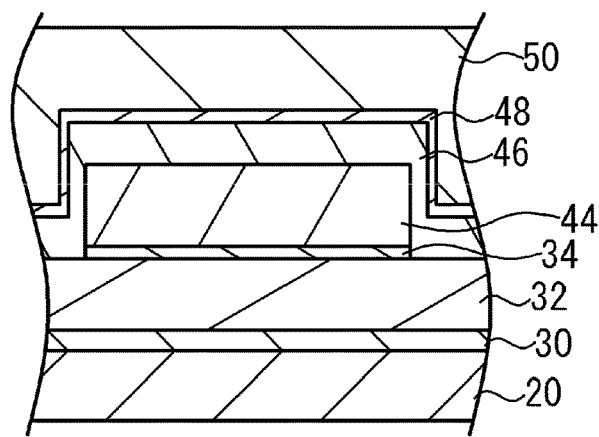

As illustrated in FIG. 2D, the resist 42 is removed, and the Ti layer 38, the Au layer 36, and the Ti layer 34 are then removed by etching. Thereafter, a dielectric film 46 is formed on the plated layer 44. A seed metal 48 is formed on the surface of the dielectric film 46. The seed metal 48 includes, for example, a Ti layer and an Au layer. Titanium tungsten (TiW) may be adopted for the seed metals 40 and 48. A plated layer 50 of Au is formed by electrolytic plating. The seed metal 40 and the plated layer 44 act as the lower electrode of the capacitor, and the seed metal 48 and the plated layer 50 act as the upper electrode.

Figure 3A:
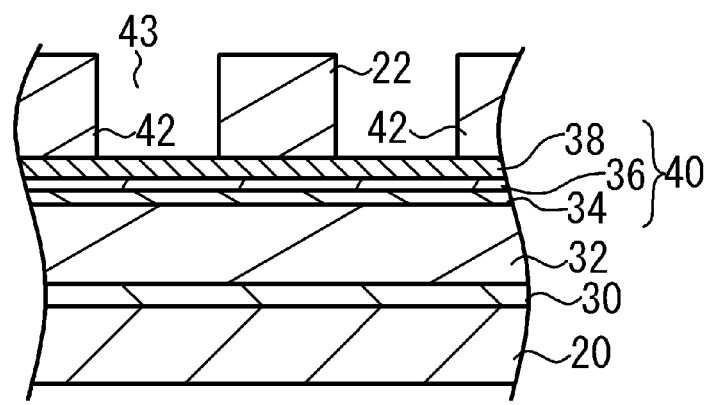
FIG. 3A to FIG. 3C are cross-sectional views illustrating the manufacturing method of the capacitor.

FIG. 3A to FIG. 4B illustrate an example where a foreign matter adheres. As illustrated in FIG. 3A, the foreign matter 22 remains in the opening 43. When the foreign matter 22 is a metal, the foreign matter 22 is included in the plated layer 44 illustrated in FIG. 2C. On the other hand, when the foreign matter 22 is resist, a defect is formed in the plated layer 44.

Figure 3B:
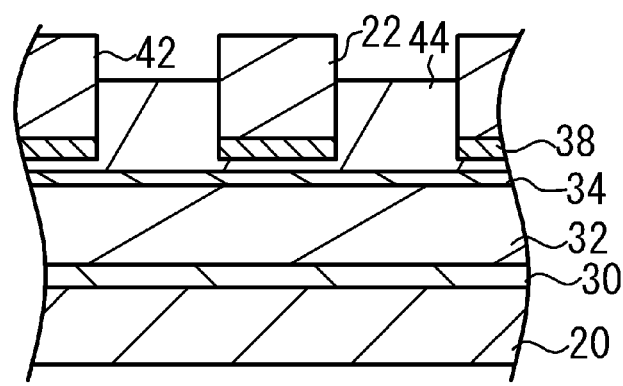
Figure 3C:
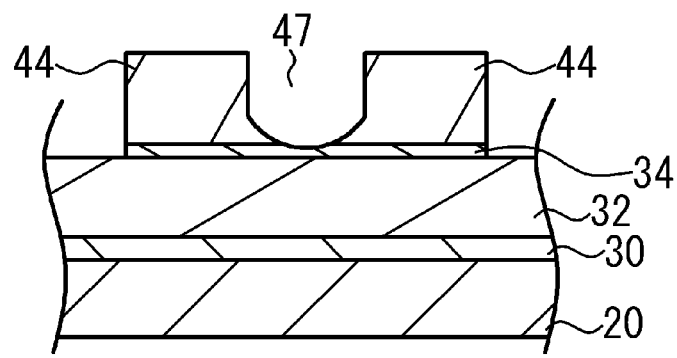

For example, foreign matters may adhere to the resist 42, and the area under the foreign matters may be unexposed. The unexposed area is not removed by development, and remains as the foreign matter 22. As illustrated in FIG. 3B, a plated layer 44 is formed between the resist 42 and the foreign matter 22 by electrolytic plating while the foreign matter 22 of resist remains. The plated layer 44 is not formed in the area where the foreign matter 22 exists. As illustrated in FIG. 3C, when the resist 42 and the foreign matter 22 are removed, a void 47 is formed in the area where the foreign matter 22 has existed.

Figure 4A:
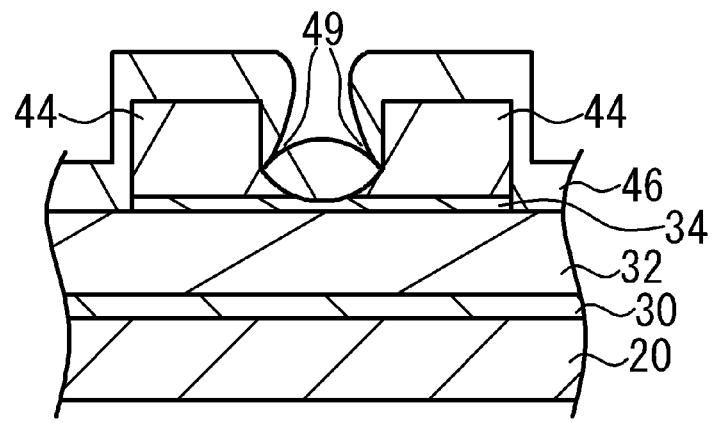
FIG. 4A and FIG. 4B are cross-sectional views illustrating the manufacturing method of the capacitor.
Figure 4B:
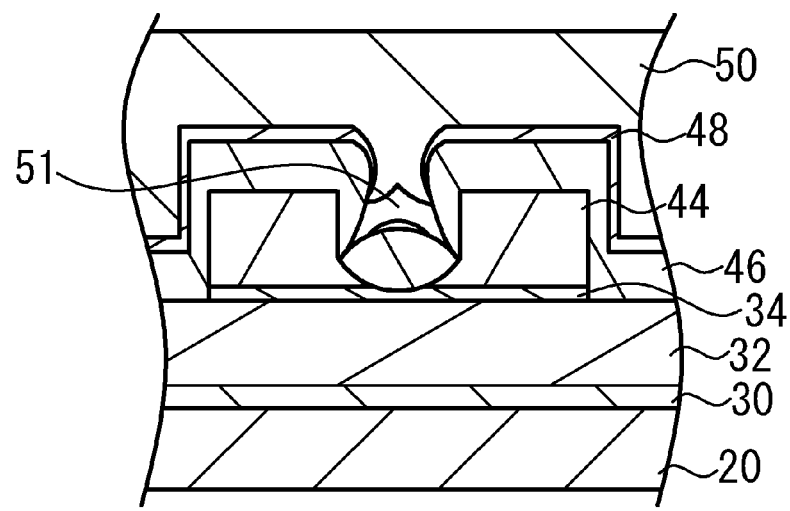

As illustrated in FIG. 4A, a dielectric film 46 is formed. The dielectric film 46 is formed along the surface of the plated layer 44, and becomes thinner from the upper surface to the side surface of the plated layer 44. Thus, voids 49 are formed in the dielectric film 46. As illustrated in FIG. 4B, a seed metal 48 is formed by sputtering, and a plated layer 50 is further formed by electrolytic plating. The seed metal 48 is formed along the surface of the dielectric film 46, but becomes thinner at closer distances to the further end of the void 49, and disappears. The plated layer 50 is not formed in the part where the seed metal 48 is absent, and a void 51 is formed in the place surrounded by the plated layer 50, the dielectric film 46, and the plated layer 44.

The dielectric film 46 is thin in the void 49, and a defect may be formed. Thus, a leak path is formed along the void 49, and a short circuit between the plated layer 44 and the plated layer 50 occurs. In addition, water such as a plating solution may remain in the void 51.

When no foreign matter exists on the wafer 20, the capacitor is manufactured through the steps illustrated in FIG. 2A to FIG. 2D. Additionally, even when a metallic foreign matter adheres to the surface of the wafer 20, the metallic foreign matter is included in the plated layer 44. Thus, a void and a leak path are less likely to be formed. On the other hand, as illustrated in FIG. 3A to FIG. 4B, when the foreign matter 22 that is the residue of the resist 42 adheres to the surface of the wafer 20, a void and a leak path are formed, and a short circuit occurs. Thus, instead of determining all the wafers 20 having the foreign matters 22 as defective products, the wafer 20 is determined to be a defective product when the foreign matter 22 is a non-metal. When the foreign matter 22 is a metal, the wafer 20 is determined to be a non-defective product, and the plated layer 44 is formed as illustrated in FIG. 2C. Thus, whether the foreign matter 22 on the wafer 20 is a metal or a non-metal such as resist is determined with use of the light reflectance.

Figure 5:
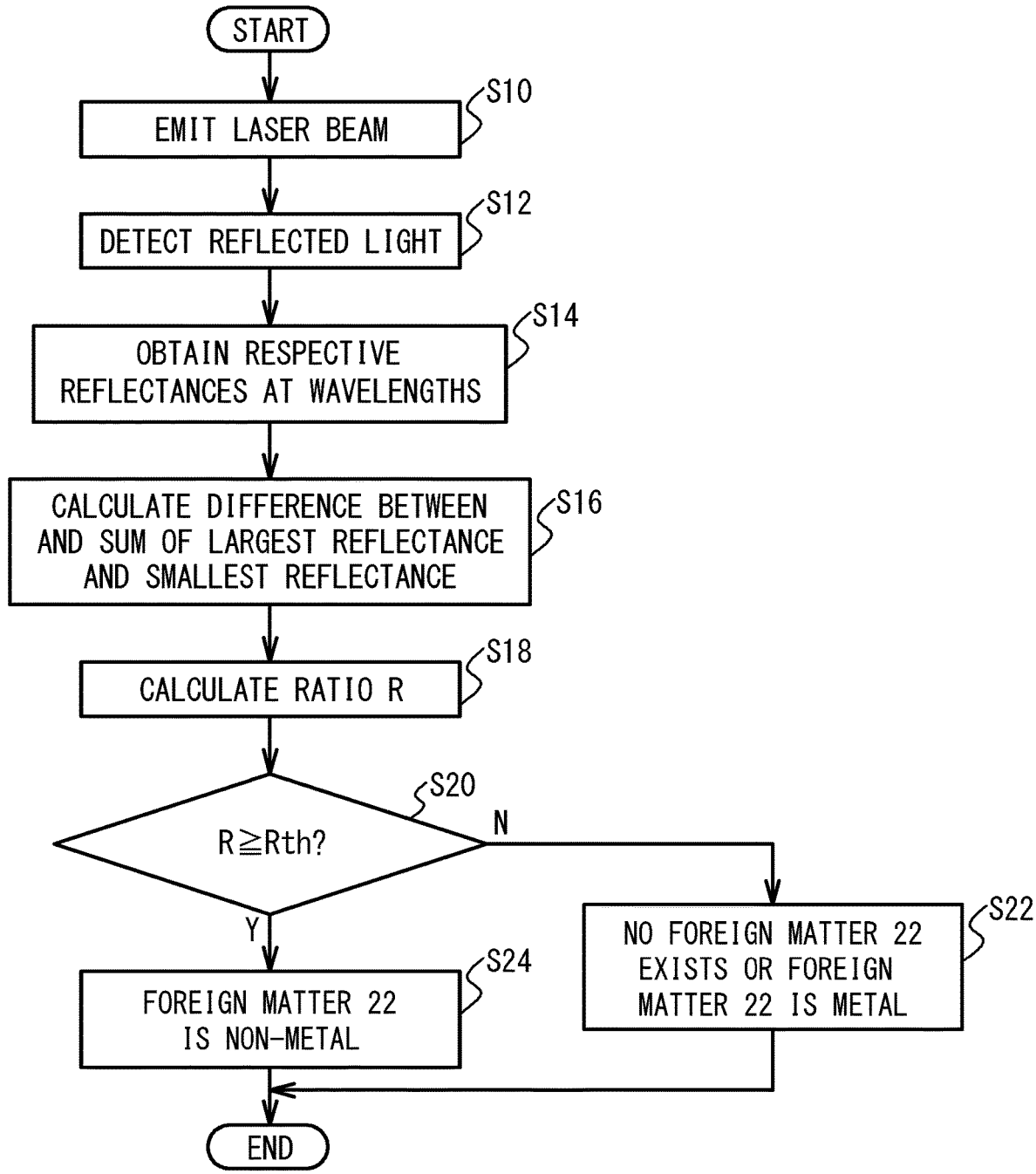
FIG. 5 is a flowchart of a surface inspection method.

FIG. 5 is a flowchart of a surface inspection method. The surface inspection is performed, for example, after the resist pattern is formed and before the plated layer 44 is formed. As illustrated in FIG. 5, the laser source 12 irradiates the foreign matter 22 with the laser beam (step S10), and the detector 14 detects the reflected light from the foreign matter 22 (step S12). The laser beam includes, for example, lights of three or more wavelengths, and all the wavelengths are 650 nm or greater.

The controller 10 obtains respective light reflectances at the wavelengths based on the intensity of the laser beam and the intensity of the reflected light (step S14). The reflectance is the ratio of the intensity of the emitted laser beam and the intensity of the reflected light. The controller 10 calculates the difference between and the sum of the largest reflectance R1 and the smallest reflectance R2 among the respective reflectances at the wavelengths (step S16), and calculates the ratio R of the difference to the sum (step S18). That is, the ratio R is calculated by the following expression.

$R=(R1-R2)/(R1+R2)$

The controller 10 determines whether the ratio R is a threshold value Rth or greater (step S20). The threshold value Rth is, for example, 0.15. When the determination is No in step S20, the controller 10 determines that no foreign matter 22 exists on the wafer 20 or that the foreign matter 22 is a metal (step S22). When no foreign matter 22 exists, the emitted light is reflected by the Ti layer 38 of the seed metal. In this case, the reflectance does not greatly vary with respect to laser beams having wavelengths of 600 nm or greater as in the case of a metallic foreign matter. Thus, the ratio R does not become the threshold value Rth or greater. Therefore, the presence or absence of the foreign matter 22 can be determined with use of the threshold value Rth. On the other hand, when the determination is Yes, the controller 10 determines that the foreign matter 22 exists on the wafer 20 and the foreign matter 22 is a non-metal such as an organic substance (step S24). The control ends as described above. As described above, when no foreign matter 22 exists or when the foreign matter 22 is a metal, the plated layer 44 is formed. On the other hand, when the foreign matter 22 is a non-metal, the plated layer 44 is not formed, and the wafer 20 is determined to be defective.

FIG. 6A to FIG. 7C illustrate reflectance. The horizontal axis represents the wavelength of the laser beam, and the laser source 12 emits a laser beam having three wavelengths of 635 nm, 670 nm, and 690 nm indicated by dotted lines. The vertical axis represents reflectance. The dotted line indicates an example where the foreign matter 22 is gold (Au), the dashed line indicates an example where the foreign matter 22 is copper (Cu), the chain line indicates an example where the foreign matter 22 is silver (Ag), and the solid line indicates an example where the foreign matter 22 is resist.

Figure 6A:
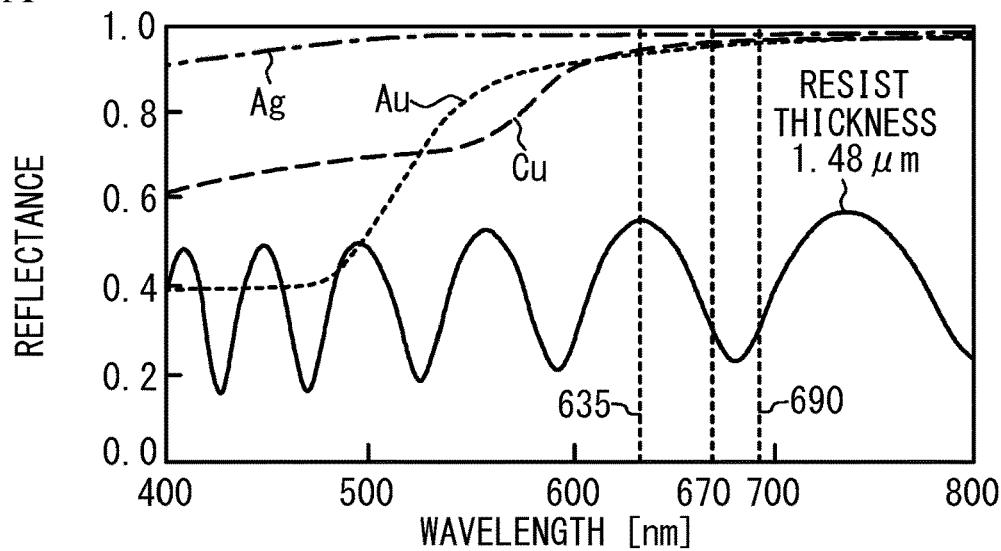
FIG. 6A to FIG. 6C illustrate reflectance.
Figure 6B:
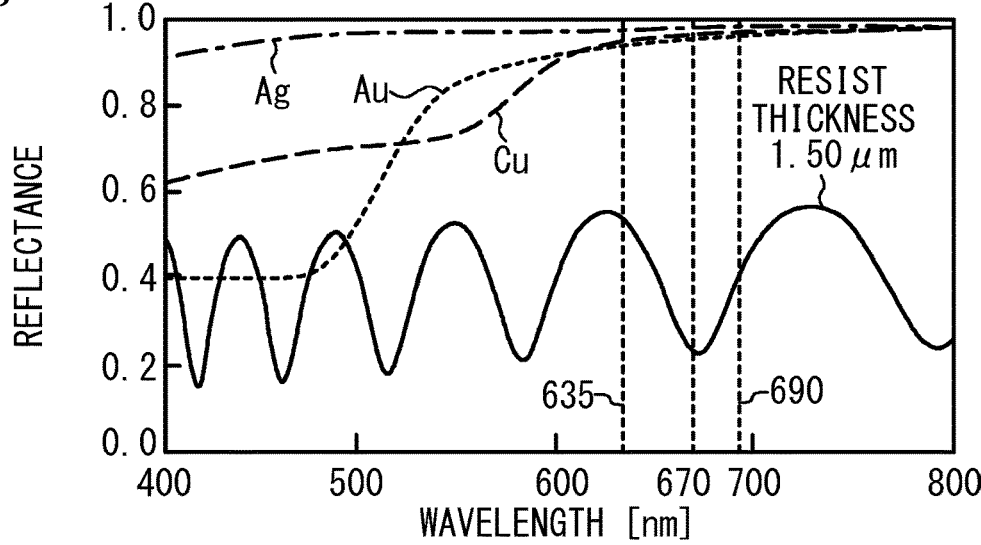
Figure 6C:
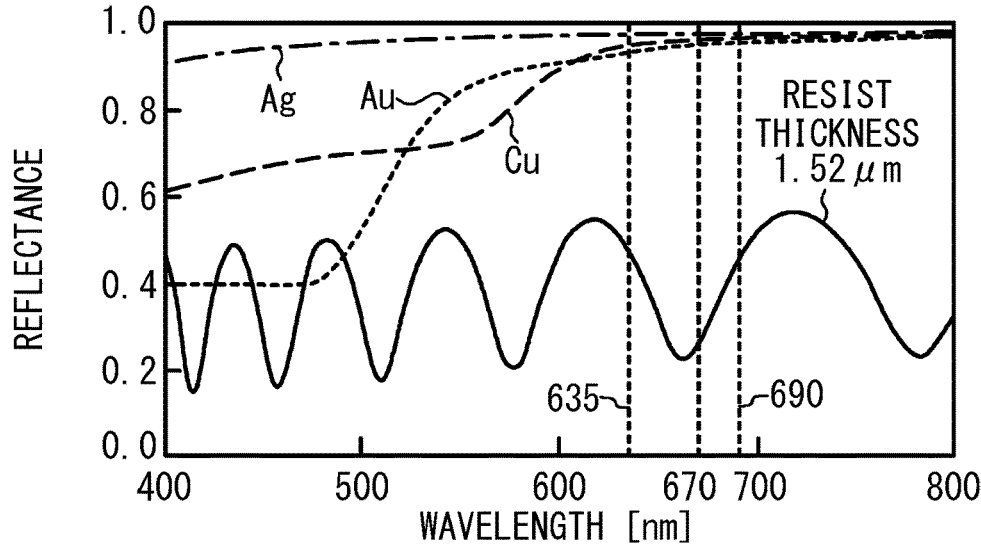
Figure 7A:
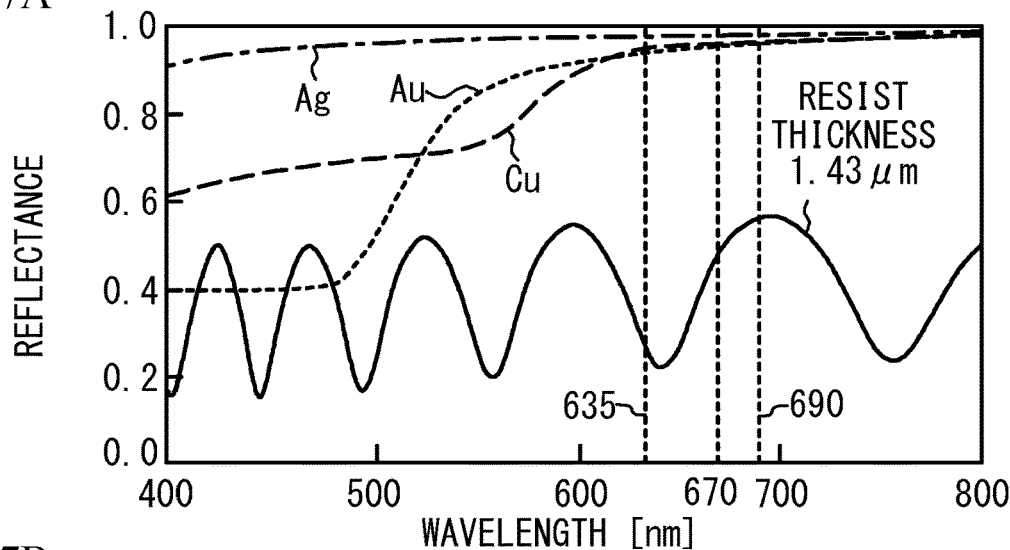
FIG. 7A to FIG. 7C illustrate reflectance.
Figure 7B:
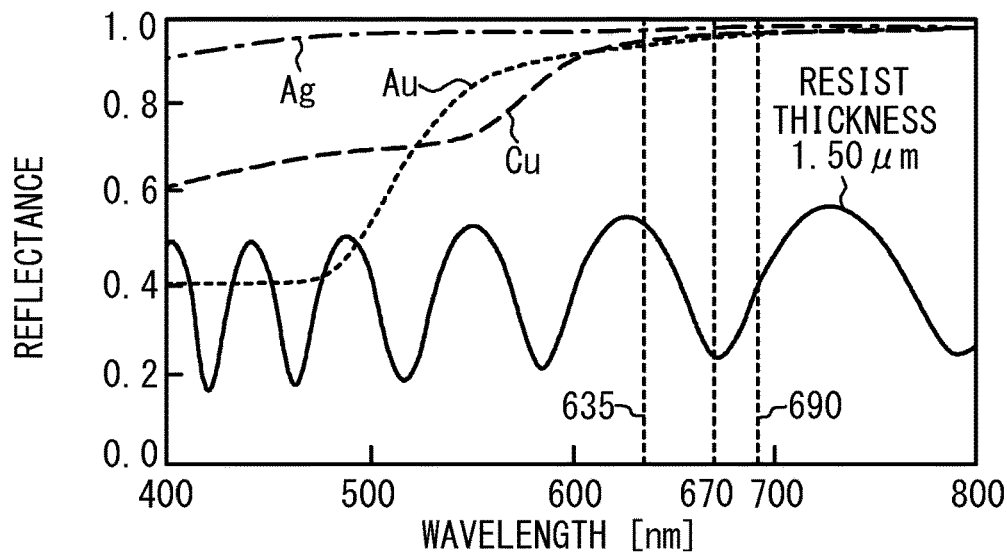
Figure 7C:
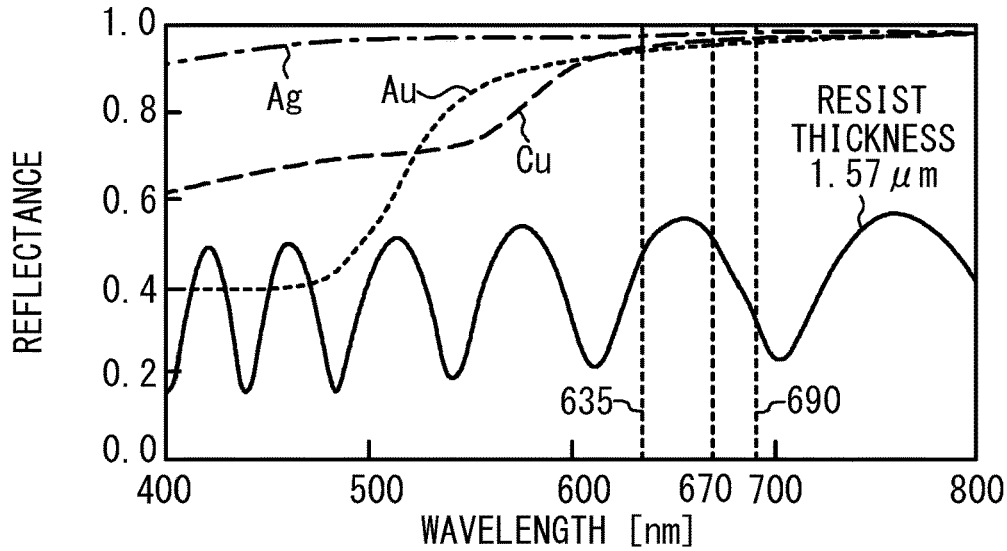

FIG. 6A to FIG. 6C respectively illustrate an example where resist has a thickness of 1.48 μm, an example where resist has a thickness of 1.50 μm, and an example where resist has a thickness of 1.52 μm. FIG. 7A to FIG. 7C respectively illustrate an example where resist has a thickness of 1.43 μm, an example where resist has a thickness of 1.50 μm, and an example where resist has a thickness of 1.57 μm.

As illustrated in FIG. 6A to FIG. 7C, when the foreign matter 22 is a metal, the reflectance is low at short wavelength and is high at long wavelength. For example, the difference between the reflectance at a wavelength of 635 nm and the reflectance at a wavelength of 670 nm is less than 0.2. On the other hand, the reflectance of resist periodically varies with respect to wavelength. For example, as illustrated in FIG. 6A to FIG. 6C, the difference between the reflectance at a wavelength of 635 nm and the reflectance at a wavelength of 670 nm is greater than those in the examples of the metals, and 0.2 or greater. Accordingly, whether the foreign matter 22 is a metal or resist can be determined by using the difference between the reflectances.

More specifically, the controller 10 calculates the difference between and the sum of the largest reflectance and the smallest reflectances among the respective reflectances at the three wavelengths, and then calculates the ratio R of the difference and the sum. For example, it is assumed that among the respective reflectances at the three wavelengths of 635 nm, 670 nm, and 690 nm, the reflectance at a wavelength of 635 nm is largest, and the reflectance at 670 nm is smallest. The controller 10 calculates the difference between and the sum of the reflectance at 635 nm and the reflectance at 670 nm (step S16 in FIG. 5). The controller 10 calculates the ratio R of them, i.e., the difference/the sum, and compares the ratio R with the threshold value Rth (steps S18 and S20).

The reflectance of resist greatly varies compared with that of a metal between the wavelengths of 635 nm and 670 nm. Thus, the ratio R in resist is greater than the ratio R in a metal. For example, when the ratio R is less than the threshold value Rth of 0.15, it is determined that no foreign matter 22 exists on the wafer 20 or that the foreign matter 22 is a metal (step S22). On the other hand, when the ratio R is the threshold value Rth or greater, it is determined that the foreign matter 22 is a non-metal (step S24). In the examples in FIG. 6A, FIG. 6B, and FIG. 6C, it can be detected that the foreign matter 22 is resist by using the reflectance at 635 nm and the reflectance at 670 nm.

In the example where resist has a thickness of 1.43 μm illustrated in FIG. 7A, among the respective reflectances at the three wavelengths, the reflectance at a wavelength of 635 nm is largest and the reflectance at a wavelength of 690 nm is smallest. In the example where resist has a thickness of 1.50 μm illustrated in FIG. 7B, the reflectance of the resist is largest at a wavelength of 635 nm, and is smallest at a wavelength of 670 nm. Thus, it can be determined whether the foreign matter 22 is a metal or a non-metal based on the difference between and the sum of the reflectances at these wavelengths.

On the other hand, in the example where resist has a thickness of 1.57 μm illustrated in FIG. 7C, the reflectance at 635 nm and the reflectance at 670 nm are nearly equal. Thus, it is difficult to determine whether the foreign matter 22 is a metal or a non-metal by using these reflectances. In this case, the reflectance at a wavelength of 670 nm and the reflectance at a wavelength of 690 nm are used because the difference between them is larger.

Figure 8A:
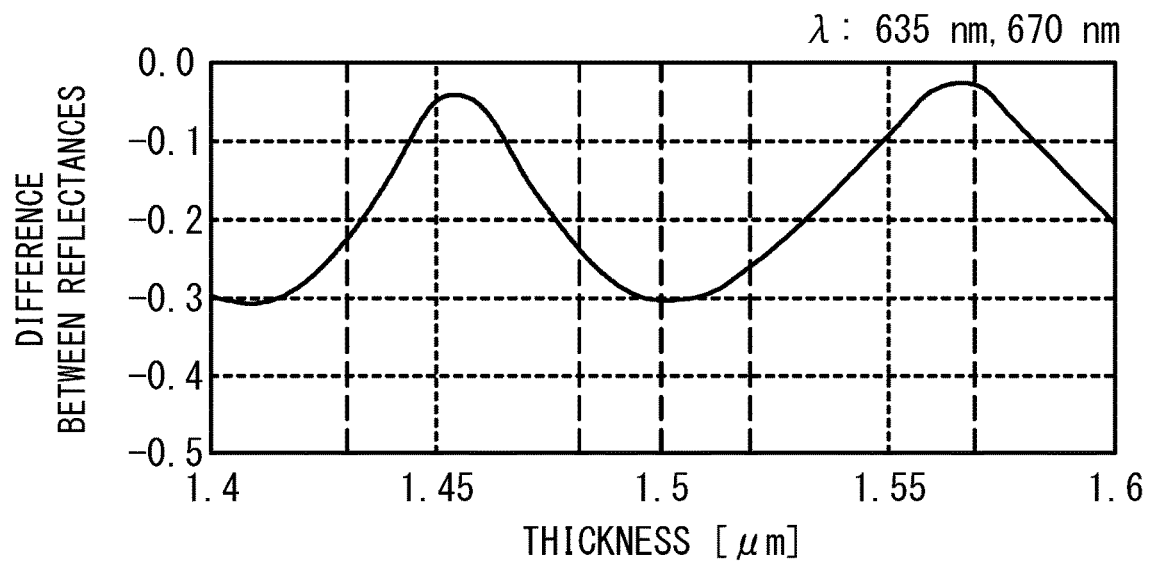
FIG. 8A and FIG. 8B illustrate a relationship between the thickness of resist and a difference between reflectances.
Figure 8B:
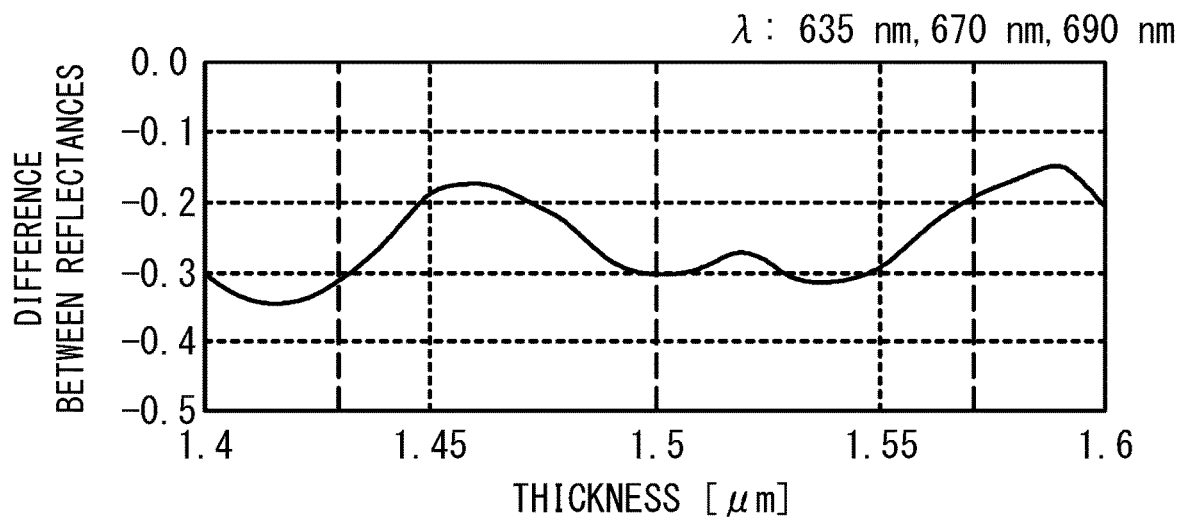

As seen above, the reflectance varies according to the thickness of resist. FIG. 8A and FIG. 8B illustrate a relationship between the thickness of resist and a difference between reflectances. The horizontal axis represents the thickness of resist, and the vertical axis represents a difference between reflectances. The difference between reflectances in FIG. 8A is the difference between the reflectance of resist with respect to a laser beam having a wavelength λ of 635 nm and the reflectance of resist with respect to a laser beam having a wavelength λ of 670 nm. As illustrated in FIG. 8A, the reflectance difference is −0.2 or less at thicknesses of 1.43 μm, 1.47 μm, 1.50 μm, and 1.53 μm. That is, the absolute value of the reflectance difference is 0.2 or greater at thicknesses of 1.43 μm, 1.47 μm, 1.50 μm, and 1.53 μm. On the other hand, the reflectance difference is greater than −0.1 at a thickness of 1.57 μm, and the absolute value thereof is less than 0.1. The reflectance difference of resist is approximately equal to the reflectance difference of a metal, and the ratio R also becomes small. Thus, it is difficult to make determination with use of a laser beam having wavelengths of 635 nm and 670 nm. Therefore, irradiation with a laser beam having three or more wavelengths is effective.

The difference between reflectances in FIG. 8B is the difference between the smallest reflectance and the largest reflectance among the reflectance with respect to a laser beam with a wavelength of 635 nm, the reflectance with respect to a laser beam with a wavelength of 670 nm, and the reflectance with respect to a laser beam with a wavelength of 690 nm. As illustrated in FIG. 8B, the reflectance difference is −0.1 or less at any thickness. The reflectance difference is approximately −0.3 at thicknesses of 1.43 μm and 1.50 μm, and is approximately −0.2 at a thickness of 1.57 μm. As described above, irradiation with a laser beam of three wavelengths causes the absolute value of the reflectance difference to be large and the ratio R to be also large at these thicknesses. Therefore, whether the foreign matter 22 is a metal or a non-metal can be accurately determined by irradiation with a laser beam of three or more wavelengths.

In the first embodiment, the laser source 12 irradiates the surface of the wafer 20 with a laser beam of three or more wavelengths, and the detector 14 detects the reflected light. The controller 10 determines whether the foreign matter 22 exists and whether the foreign matter 22 is a metal or a non-metal based on the reflectances of the surface with respect to the laser beam. When the foreign matter 22 is a non-metal such as resist, the reflected lights interfere with each other, and therefore, the reflectance periodically varies with respect to wavelength. When no foreign matter 22 exists or when the foreign matter 22 is a metal, the reflectance does not periodically vary with respect to wavelength. Thus, the determination is possible based on difference in behavior of the reflectance with respect to wavelength described above. For example, methods such as energy dispersive x-ray spectrometry (EDX) need several minutes for the analysis of one foreign matter 22, and it takes a long time for determination. In contrast, in the first embodiment, whether the foreign matter 22 exists and whether the foreign matter 22 is a metal or a non-metal can be determined rapidly based on the reflectances with respect to the laser beam.

The controller 10 obtains respective reflectances at the distinct wavelengths, and performs determination based on the difference between two reflectances. The reflectance of resist periodically varies with respect to wavelength, and the difference between reflectances of resist is larger than that of a metal. Thus, highly accurate determination is possible. For example, when the difference between reflectances is a predetermined value or greater, it may be determined that the foreign matter 22 is resist, whereas when the difference is less than the predetermined value, it may be determined that no foreign matter 22 exists or that the foreign matter 22 is a metal. However, because the absolute value of the reflectance varies according to the surface roughness of the foreign matter 22, the accuracy of the determination may decrease when only the difference between reflectances is used.

In light of this, the controller 10 calculates the difference between and the sum of the largest reflectance and the smallest reflectance among the respective reflectances at the wavelengths, and also calculates the ratio R of the difference to the sum. For example, when the ratio R is less than 0.15, the controller 10 determines that no foreign matter 22 exists or that the foreign matter 22 is a metal. For example, when the ratio R is 0.15 or greater, the controller 10 determines that the foreign matter 22 is a non-metal. Accordingly, highly accurate determination is possible.

The three or more distinct wavelengths of the laser beam are preferably 600 nm or greater. For example, as illustrated in FIG. 6A, the reflectance of a metal is low at short wavelengths and large at long wavelengths. The reflectance of copper is approximately 0.7 at a wavelength of 500 nm, and is 0.9 or greater and nearly constant at wavelengths of 600 nm or greater. On the other hand, the reflectance of resist periodically varies with respect to wavelength. By using a laser beam with wavelengths of 600 nm or greater, the ratio R obtained from the metallic foreign matter 22 becomes small and the ratio R obtained from the resist foreign matter 22 becomes large. Therefore, accurate determination is possible. When no foreign matter 22 exists, the ratio R is small because the light is reflected by the metal on the surface of the wafer 20.

The seed metal 40 is formed on the surface of the wafer 20, and the resist 42 is formed on the seed metal 40. The residue of resist after formation of the pattern of the resist 42 may form the foreign matter 22. In the first embodiment, it is possible to determine that the foreign matter 22 is resist. For example, the inside of the opening 43 of the resist 42 may be swept by a laser beam. The controller 10 estimates that the metallic foreign matter 22 or the seed metal 40 is irradiated with the laser beam when the ratio R is less than 0.15, and estimates that the resist foreign matter 22 is irradiated with the laser beam when the ratio R is 0.15 or greater. Thus, whether the foreign matter 22 is a metal or a non-metal can be determined.

The plated layer 44 is formed on the seed metal 40, and the plated layer 44 acts as the lower electrode of the capacitor. The metallic foreign matter 22 is included in the plated layer 44. On the other hand, the resist foreign matter 22 causes defects of the plated layer 44 and the dielectric film 46, and a leak path is formed in the capacitor. When a voltage is applied to the capacitor, a short circuit through the leak path is likely to occur. A passive element and an active element other than the capacitor may be formed on the wafer 20. The residue of resist may form foreign matters when a pad is formed. In the first embodiment, it is determined whether the foreign matter 22 is a metal or resist. The wafer 20 to which the resist foreign matter 22 adheres is screened out as being defective, and thereby, the manufacture of defective capacitors is inhibited.

Second Embodiment

Also in a second embodiment, as in the first embodiment, the process illustrated in FIG. 5 is performed with the surface inspection device 100 illustrated in FIG. 1. The second embodiment uses a laser beam of five wavelengths.

Figure 9A:
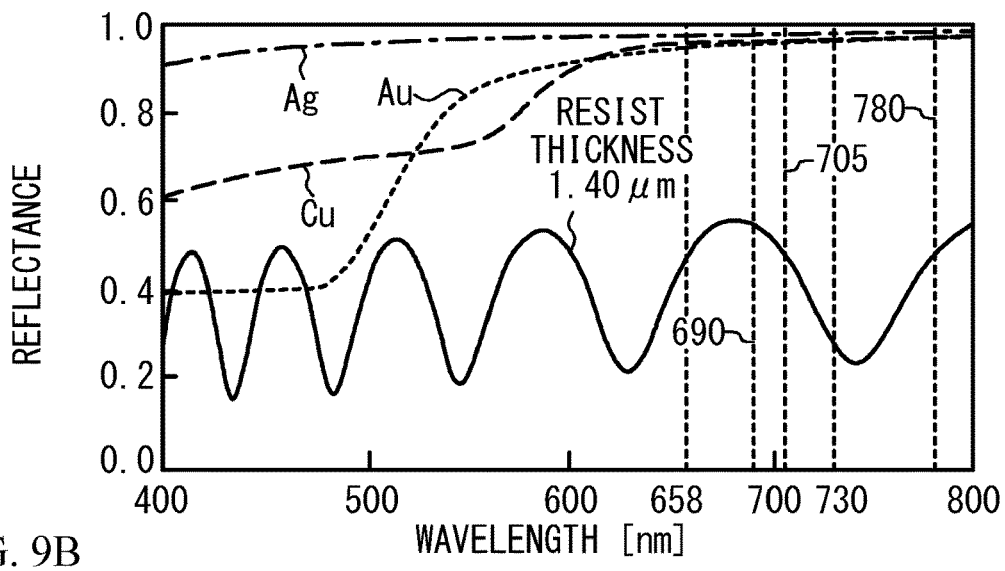
FIG. 9A to FIG. 9C illustrate reflectance.
Figure 9B:
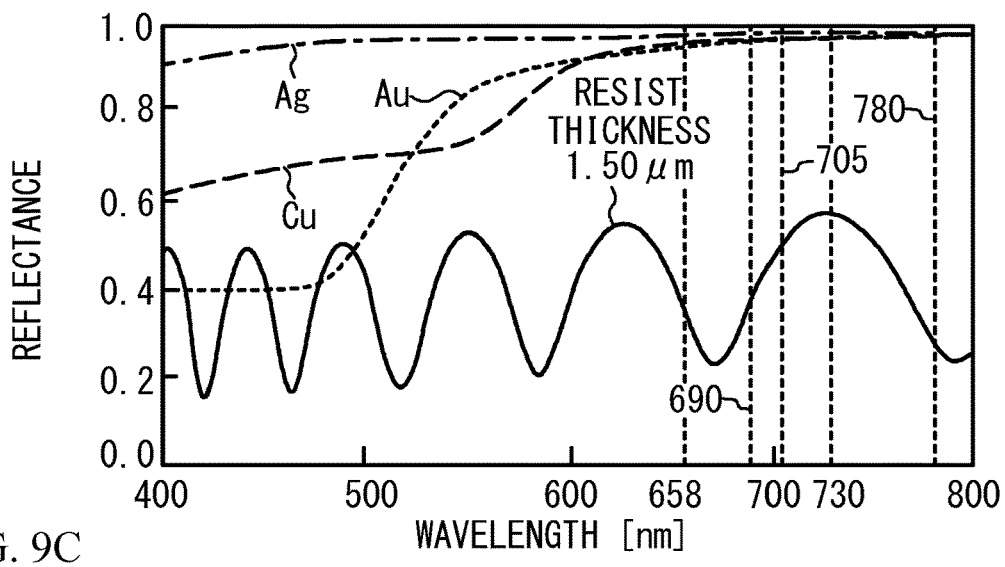
Figure 9C:
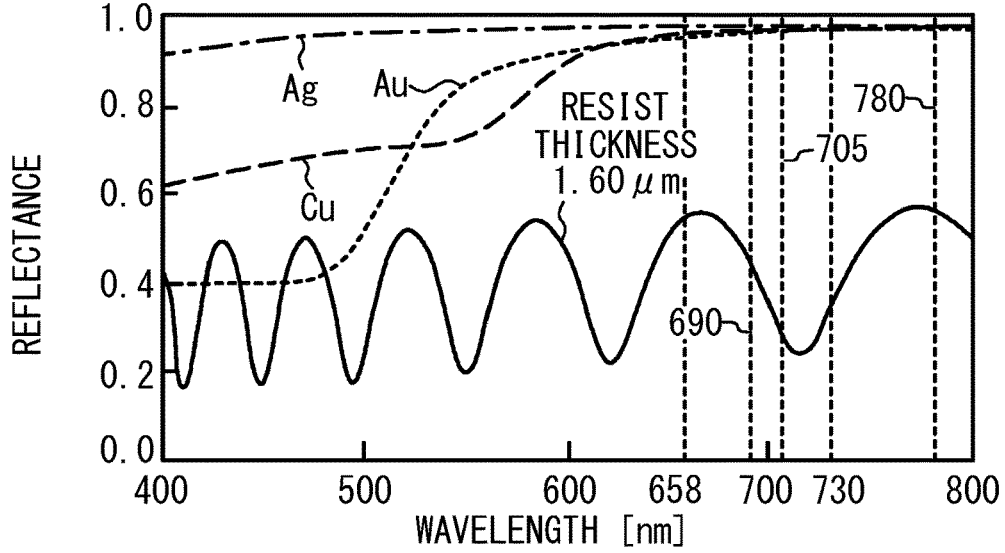

FIG. 9A to FIG. 9C illustrate reflectance, and respectively illustrate an example where resist has a thickness of 1.40 μm, an example where resist has a thickness of 1.50 μm, and an example where resist has a thickness of 1.60 μm. The laser source 12 emits a laser beam of five wavelengths of 658 nm, 690 nm, 705 nm, 730 nm, and 780 nm indicated by dotted lines. When the foreign matter 22 is a metal, the reflectance is low at short wavelength and high at long wavelength. On the other hand, when the foreign matter 22 is resist, the reflectance periodically varies with respect to wavelength.

As illustrated in FIG. 5, the controller 10 uses the largest reflectance and the smallest reflectance among the reflectances of resist to calculate the difference therebetween, the sum thereof, and the ratio R of the difference to the sum. In the example illustrated in FIG. 9A, the reflectance of resist is largest at 690 nm and smallest at 730 nm among the respective reflectances at the five wavelengths. In the example illustrated in FIG. 9B, the reflectance of resist is largest at 730 nm and is smallest at 780 nm among the respective reflectances at the five wavelengths. In the example illustrated in FIG. 9C, the reflectance of resist is largest at 780 nm and smallest at 705 nm among the respective reflectances at the five wavelengths. The differences between these reflectances is larger than that of a metal. Thus, the controller 10 can determine whether the foreign matter 22 exists and whether the foreign matter 22 is a metal or a non-metal by calculating the ratio R from these reflectances.

Figure 10:
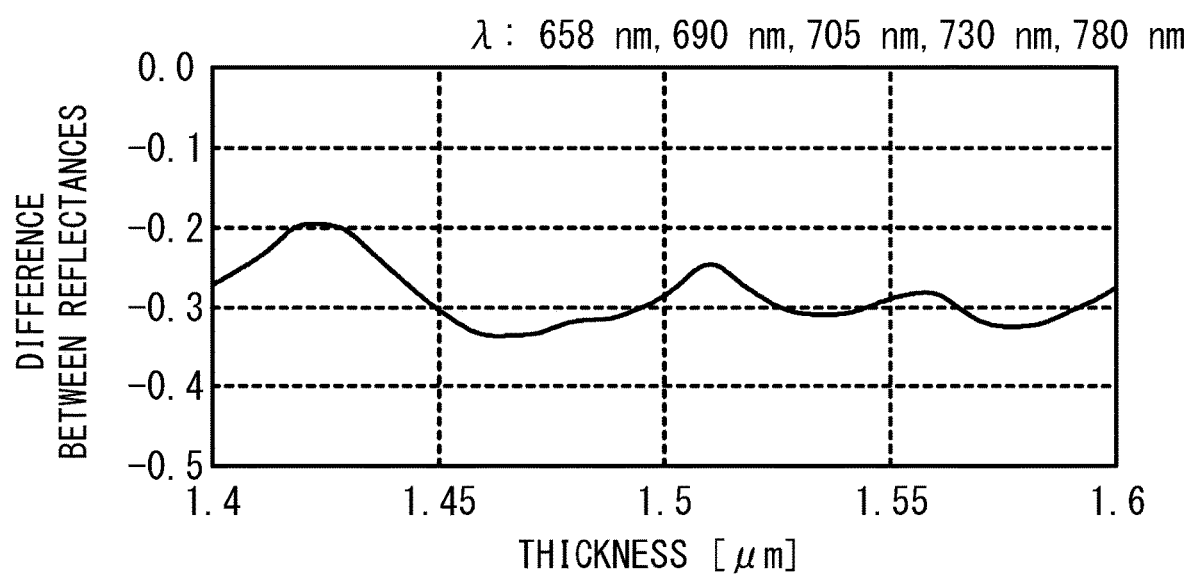
FIG. 10 illustrates a relationship between the thickness of resist and a difference between reflectances.

FIG. 10 illustrates a relationship between the thickness of resist and a difference between reflectances. The horizontal axis represents the thickness of resist, and the vertical axis represents a difference in reflectance. The difference between reflectances is the difference between the largest reflectance and the smallest reflectance among the reflectances with respect to laser beams with wavelengths of 658 nm, 690 nm, 705 nm, 730 nm, and 780 nm. As illustrated in FIG. 10, the largest reflectance difference is approximately −0.2, and the reflectance difference is around −0.3 at thicknesses of 1.45 to 1.6. Thus, the ratio R is large. Accordingly, whether the foreign matter 22 exists or whether the foreign matter 22 is a metal or a non-metal can be accurately determined by irradiation with a laser beam of five wavelengths. A laser beam of five or more wavelengths such as six wavelengths or eight wavelengths may be used.

In the second embodiment, the laser source 12 emits a laser beam of five or more wavelengths, and the controller 10 determines whether the foreign matter 22 exists and whether the foreign matter 22 is a metal or a non-metal based on the reflectances of the foreign matter 22 with respect to the laser beam. Thus, whether the foreign matter 22 is a metal or a non-metal can be rapidly determined. In particular, the use of the laser beam of five or more wavelengths causes the ratio R in resist to be large. On the other hand, the reflectance of a metal does not greatly vary with respect to the five or more wavelengths, and thus, the ratio R is small. Therefore, highly accurate determination is possible.

Although the embodiments of the present invention have been described in detail, it is to be understood that the various change, substitutions, and alterations could be made hereto without departing from the spirit and scope of the invention.

What is claimed is:

1. A method for inspecting a surface of a wafer, the method comprising steps of:

irradiating a surface of the wafer with a laser beam having three or more distinct wavelengths;

detecting reflected light reflected from the surface of the wafer irradiated with the laser beam; and determining whether foreign matter exists on the surface of the wafer based on reflectances of the surface of the wafer with respect to the laser beam having the three or more distinct wavelengths, wherein the step of determining whether foreign matter exists includes a step of determining whether the foreign matter is a metal or a non-metal, and the step of determining whether the foreign matter is a metal or a non-metal includes steps of:
- obtaining a largest reflectance and a smallest reflectance among the respective reflectances at the distinct wavelengths,
- obtaining a difference between the largest reflectance and the smallest reflectance and a sum of the largest reflectance and the smallest reflectance, and
- determining that the foreign matter is a metal when a ratio of the difference to the sum is less than 0.15, and that the foreign matter is a non-metal when the ratio is 0.15 or greater.

2. The method according to claim 1, wherein
the step of determining whether the foreign matter is a metal or a non-metal includes steps of: obtaining respective reflectances at the distinct wavelengths, and determining whether the foreign matter is a metal or a non-metal based on a difference between two reflectances of the respective reflectances at the distinct wavelengths.

3. The method according to claim 1, wherein
each of the three or more distinct wavelengths of the laser beam is 600 nm or greater.

4. The method according to claim 1, further comprising a step of:
irradiating the surface of the wafer with a laser beam having five or more distinct wavelengths.

* * * * *